(12) United States Patent
Kim

(10) Patent No.: US 11,237,619 B2
(45) Date of Patent: Feb. 1, 2022

(54) POWER GATING SYSTEM AND ELECTRONIC SYSTEM INCLUDING THE SAME

(71) Applicant: SK hynix Inc., Icheon-si Gyeonggi-do (KR)

(72) Inventor: Woongrae Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 288 days.

(21) Appl. No.: 16/507,657

(22) Filed: Jul. 10, 2019

(65) Prior Publication Data

US 2020/0142473 A1    May 7, 2020

(30) Foreign Application Priority Data

Nov. 5, 2018  (KR) .................. 10-2018-0134561

(51) Int. Cl.
| | |
|---|---|
| G06F 1/3287 | (2019.01) |
| H03K 19/00 | (2006.01) |
| G06F 1/3203 | (2019.01) |
| G06F 1/3225 | (2019.01) |
| G06F 1/3234 | (2019.01) |

(52) U.S. Cl.
CPC .......... *G06F 1/3287* (2013.01); *G06F 1/3203* (2013.01); *H03K 19/0016* (2013.01); *G06F 1/3225* (2013.01); *G06F 1/3275* (2013.01)

(58) Field of Classification Search
CPC .... G06F 1/3287; G06F 1/3203; G06F 1/3275; G06F 1/3225
USPC ................................. 713/320, 324
See application file for complete search history.

(56) References Cited

U.S. PATENT DOCUMENTS

| | | | |
|---|---|---|---|
| 7,873,923 B2 | 1/2011 | Charlebois et al. | |
| 9,665,144 B2 | 5/2017 | Nasrullah et al. | |
| 2010/0231255 A1* | 9/2010 | Kim ................. | H03K 19/0013 326/33 |
| 2011/0040995 A1* | 2/2011 | Basak ................. | G06F 1/3203 713/324 |
| 2011/0320843 A1* | 12/2011 | Lee .................... | H03K 19/0013 713/323 |
| 2012/0166731 A1* | 6/2012 | Maciocco ........... | G06F 1/3275 711/130 |
| 2015/0095672 A1* | 4/2015 | Haraguchi ........... | G06F 1/329 713/320 |
| 2015/0198991 A1* | 7/2015 | Bircher ................ | G06F 1/3287 713/323 |
| 2015/0355662 A1* | 12/2015 | Myers ................. | G06F 1/26 323/311 |
| 2020/0334044 A1* | 10/2020 | Takeuchi ............ | G06F 1/26 |

FOREIGN PATENT DOCUMENTS

| | | |
|---|---|---|
| CN | 103456356 A | 12/2013 |
| CN | 106877290 A | 6/2017 |
| CN | 108665918 A | 10/2018 |

* cited by examiner

*Primary Examiner* — Ji H Bae
(74) *Attorney, Agent, or Firm* — William Park & Associates Ltd.

(57) ABSTRACT

A power gating system may include a logic circuit area configured to perform a power-down operation according to at least one power-down control signal. The power gating system may also include a power gating control circuit configured to generate the at least one power-down control signal when a power-down request period is equal to or greater than a preset time according to a power-down mode signal.

25 Claims, 7 Drawing Sheets

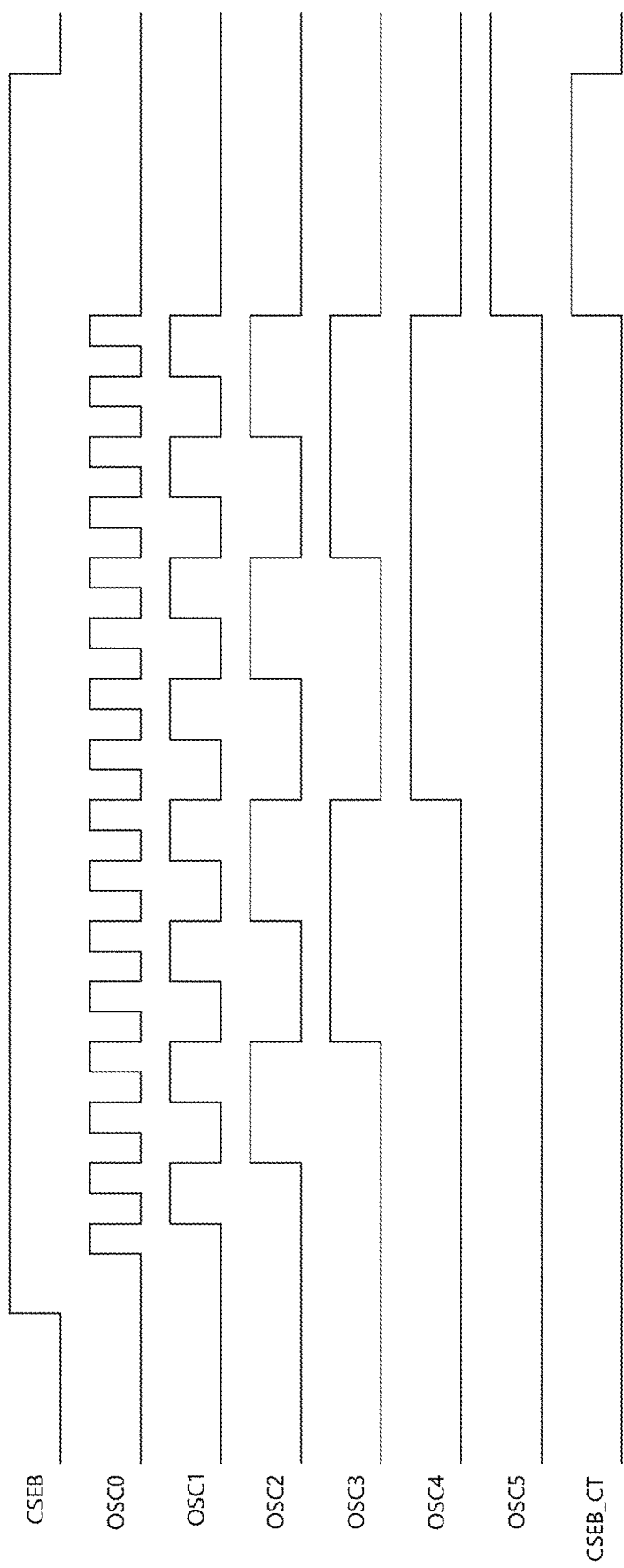

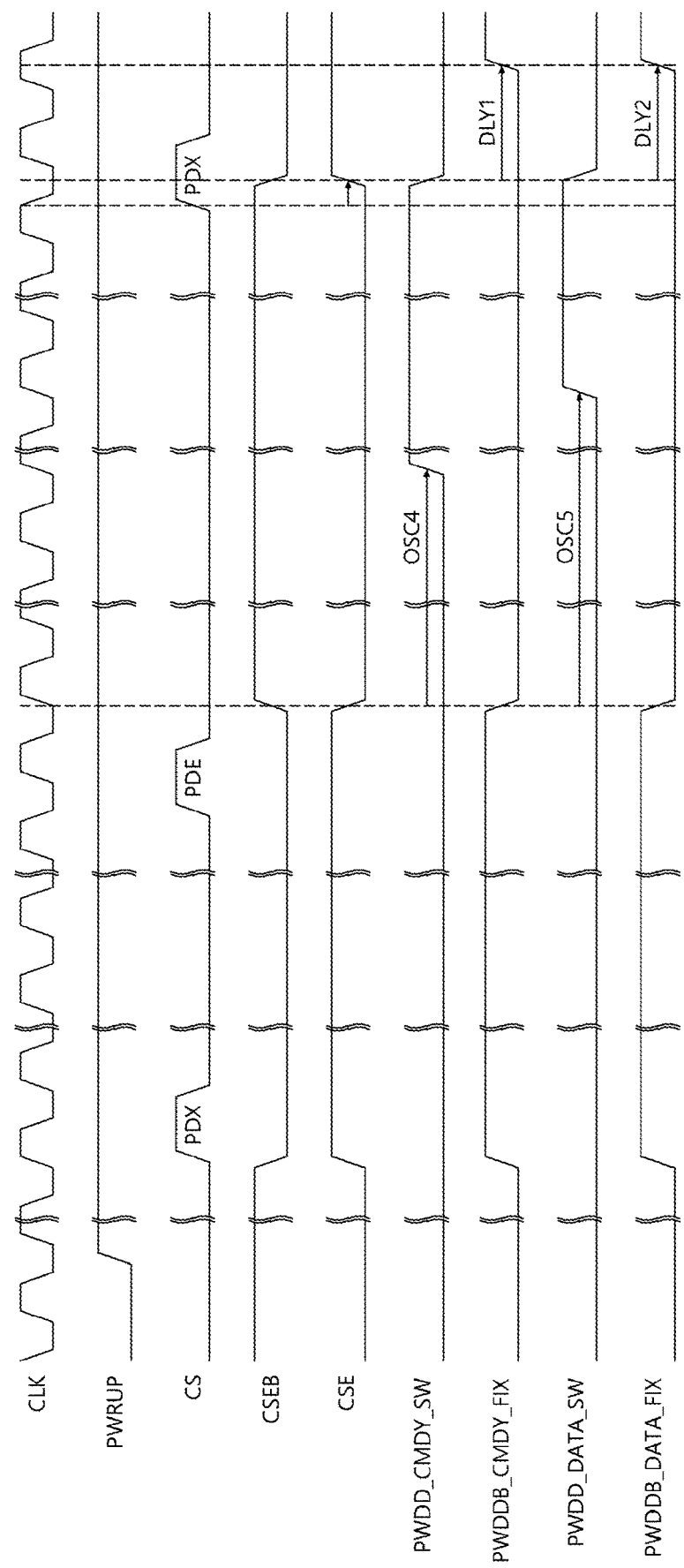

POWER GATING SYSTEM AND ELECTRONIC SYSTEM INCLUDING THE SAME

CROSS-REFERENCES TO RELATED APPLICATION

The present application claims priority under 35 U.S.C. § 119(a) to Korean application number 10-2018-0134561, filed on Nov. 5, 2018, in the Korean Intellectual Property Office, which is incorporated herein by reference in its entirety.

BACKGROUND

1. Technical Field

Various embodiments generally relate to a semiconductor circuit, and, more particularly, to a power gating system and an electronic system including the same.

2. Related Art

While electronic devices, for example, portable electronic devices are becoming smaller and lighter, the number of functional blocks embedded in the portable electronic devices are continuously increasing.

Because portable electronic devices operate from a limited power source, that is, a battery, it is necessary to reduce power unnecessarily consumed by the functional blocks in a power-down mode.

To this end, portable electronic devices employ a power gating technology for substantially preventing power from being unnecessarily supplied to the functional blocks in the power-down mode.

SUMMARY

A power gating system capable of performing a stable power gating operation while reducing current consumption and an electronic system including the same are described herein.

In an embodiment, a power gating system may include a logic circuit area configured to perform a power-down operation according to at least one power-down control signal. The power gating system may also include a power gating control circuit configured to generate the at least one power-down control signal when a power-down request period is equal to or greater than a preset time according to a power-down mode signal.

In an embodiment, a power gating system may include a logic circuit area divided into a first area and a second area and configured to perform a power-down operation for the first area and the second area according to a plurality of power-down control signals. The power gating system may also include a power gating control circuit configured to generate the plurality of power-down control signals with a time difference when a power-down request period according to a power-down mode signal is equal to or more than a preset time.

In an embodiment, a power gating system may include a logic circuit area, including a plurality of logic circuit blocks, divided into a first area and a second area and configured to perform a power-down operation for the first area and the second area and perform a floating prevention operation for logic circuit blocks not subjected to the power-down operation among the plurality of logic circuit blocks, according to first to fourth power-down control signals. The power gating system may also include a power gating control circuit configured to generate the first to fourth power-down control signals with a time difference, wherein a period of the floating prevention operation includes a period of the power-down operation, when a power-down request period according to a power-down mode signal is equal to or more than a preset time.

In an embodiment, an electronic system may include a processor configured to generate a power-down command by using a chip select signal and a command/address signal. The electronic system may also include a semiconductor memory including a logic circuit area divided into a first area and a second area and configured to perform a power-down operation for the first area and the second area with a time difference when a power-down period according to the power-down command is equal to or greater than a preset time.

According to the present teachings, it is possible to perform a stable power gating operation while reducing current consumption.

BRIEF DESCRIPTION OF THE DRAWINGS

FIG. 6 is a timing diagram for explaining an operation of a power-down reference signal generation circuit of FIG. 5.

FIG. 7 is a timing diagram for explaining an operation of a power-down control signal generation circuit of FIG. 5.

DETAILED DESCRIPTION

A power gating system and an electronic system including the same are described below with reference to the accompanying drawings through various examples of embodiments.

Figure 1:
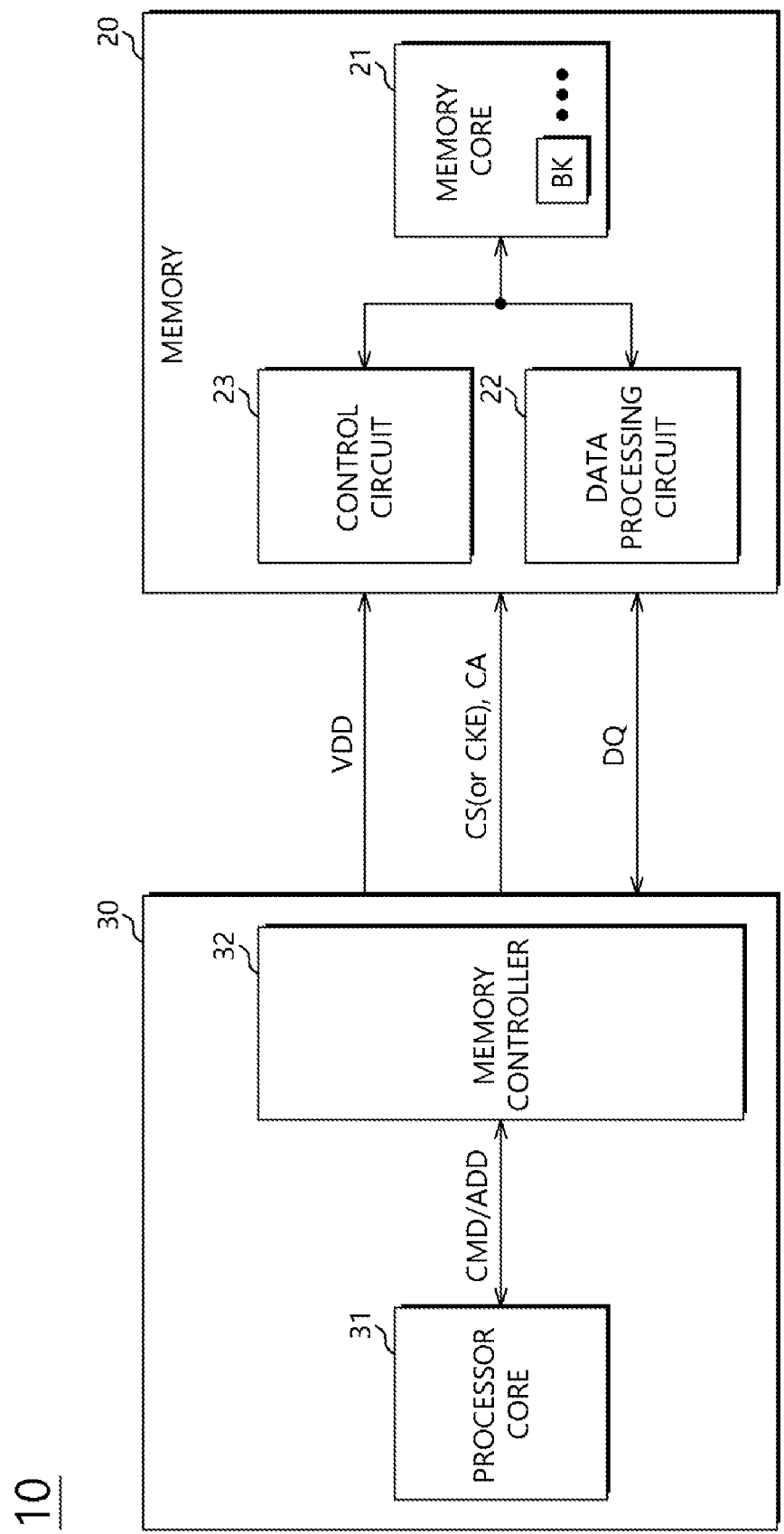
FIG. 1 is a block diagram illustrating a configuration of an electronic system, in accordance with an embodiment.

Referring to FIG. 1, an electronic system 10, in accordance with the embodiment, may include a memory 20 and a processor 30.

The electronic system 10 may be configured in the form of a system on chip (SoC).

The processor 30 may include a central processing unit (CPU) or a graphic processing unit (GPU).

The processor 30 may include a processor core 31 and a memory controller 32.

The processor core 31 may provide the memory controller 32 with various commands CMD for controlling the memory 20 and an address ADD.

The memory controller 32 may provide the memory 20 with a power supply voltage VDD, a chip select signal CS, and a command/address signal CA according to the commands CMD and the address ADD provided by the processor core 31, thereby controlling the memory 20.

The memory controller 32 may provide the memory 20 with a clock enable signal CKE, instead of the chip select signal CS, according to the type of the processor 30 and/or the type of the memory 20.

The memory controller 32 may transmit/receive data DQ to/from the memory 20.

The memory 20, that is, a semiconductor memory, may include a memory core 21, a data processing circuit 22, and a control circuit 23.

The memory core 21 may include a plurality of unit memory areas, for example, memory banks BK and circuit configurations for data input/output of the memory banks BK.

The data processing circuit 22 may perform data input/output-related operations between the memory core 21 and the memory controller 32.

The control circuit 23 may control a data read/write operation, a power gating-related operation, and the like of the memory 20 according to the chip select signal CS and the command/address signal CA provided by the memory controller 32 of the processor 30.

Figure 2:
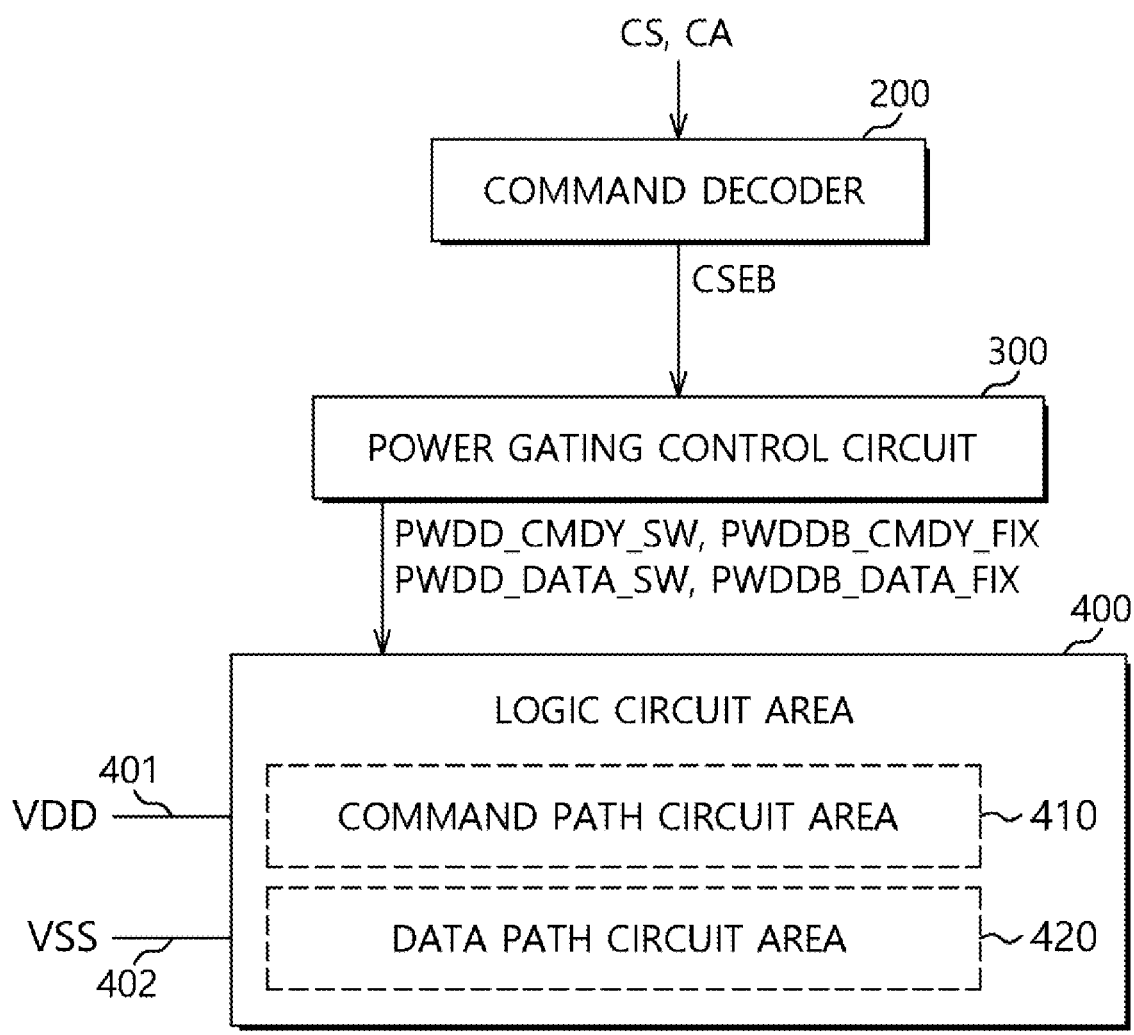
FIG. 2 is a block diagram illustrating a configuration of a power gating system, in accordance with an embodiment.

FIG. 2 is a diagram illustrating a configuration of a power gating system 100, in accordance with an embodiment.

The power gating system 100 may be provided in the memory 20 of FIG. 1, for example.

As illustrated in FIG. 2, the power gating system 100 may include a command decoder 200, a power gating control circuit 300, and a logic circuit area 400.

The logic circuit area 400 may include a plurality of logic circuit blocks.

The plurality of logic circuit blocks of the logic circuit area 400 may be divided into a first area and a second area, that is, a command path circuit area 410 and a data path circuit area 420.

The command path circuit area 410 and the data path circuit area 420 may be connected in common with a plurality of power rails 401 and 402 for providing a power supply voltage VDD and a ground voltage VSS.

The command path circuit area 410 may include logic circuit blocks related to command processing.

The data path circuit area 420 may include logic circuit blocks related to data input/output.

A power-down operation of the logic circuit area 400 may be controlled according to a plurality of power-down control signals PWDD_CMDY_SW, PWDDB_CMDY_FIX, PWDD_DATA_SW, and PWDDB_DATA_FIX.

In the power-down operation, power-down switches of logic circuit blocks (hereinafter, referred to as power gating blocks) including the power-down switches among the logic circuit blocks of the logic circuit area 400, which are described later, may be turned off, thereby cutting off the power to the power gating blocks.

The power-down operation and/or a floating prevention operation of the logic circuit area 400 may be controlled according to the plurality of power-down control signals PWDD_CMDY_SW, PWDDB_CMDY_FIX, PWDD_DATA_SW, and PWDDB_DATA_FIX.

In the floating prevention operation, isolators, which are electrically connected to logic circuit blocks (hereinafter, referred to as no power gating blocks) including no power-down switches among the logic circuit blocks of the logic circuit area 400, which are described later, may output a signal at a specific logic level to substantially prevent the floating of input terminals of the no power gating blocks, thereby blocking the generation of a leakage current.

The command decoder 200 may generate various control signals including a power-down mode signal CSEB by decoding the chip select signal CS and the command/address signal CA inputted from an external source. In different embodiments, from an external source means the chip select signal CS and the command/address signal CA are inputted from outside the command decoder, from outside the power gating system 100, or from outside the memory 20 in which the power gating system 100 is located.

The power gating control circuit 300 may generate the plurality of power-down control signals PWDD_CMDY_SW, PWDDB_CMDY_FIX, PWDD_DATA_SW, and PWDDB_DATA_FIX according to the power-down mode signal CSEB.

The power gating control circuit 300 may generate the plurality of power-down control signals PWDD_CMDY_SW, PWDDB_CMDY_FIX, PWDD_DATA_SW, and PWDDB_DATA_FIX for allowing the power-down operation to be performed for the logic circuit area 400 only when a power-down request period is equal to or greater than a preset time according to the power-down mode signal CSEB.

The power gating control circuit 300 may generate the plurality of power-down control signals PWDD_CMDY_SW, PWDDB_CMDY_FIX, PWDD_DATA_SW, and PWDDB_DATA_FIX for allowing the power-down operation of each of the command path circuit area 410 and the data path circuit area 420 of the logic circuit area 400 to be performed with a preset time difference according to the power-down mode signal CSEB.

The power gating control circuit 300 may generate the plurality of power-down control signals PWDD_CMDY_SW, PWDDB_CMDY_FIX, PWDD_DATA_SW, and PWDDB_DATA_FIX for allowing a period of the floating prevention operation (hereinafter, referred to as a floating prevention period) of the logic circuit area 400 to include a period of the power-down operation (hereinafter, referred to as a power-down period) according to the power-down mode signal CSEB.

The first power-down control signal PWDD_CMDY_SW may be a signal for controlling the power-down operation of the command path circuit area 410. The first power-down control signal PWDD_CMDY_SW may be activated only when the power-down request period according to the power-down mode signal CSEB is substantially maintained for the preset time or more.

The second power-down control signal PWDDB_CMDY_FIX may be a signal for controlling the floating prevention operation of the command path circuit area 410. The second power-down control signal PWDDB_CMDY_FIX may have a wider activation period than the first power-down control signal PWDD_CMDY_SW.

The third power-down control signal PWDD_DATA_SW may be a signal for controlling the power-down operation of the data path circuit area 420. The third power-down control signal PWDD_DATA_SW may be activated with a preset time difference with the first power-down control signal PWDD_CMDY_SW only when the power-down request period according to the power-down mode signal CSEB is substantially maintained for the preset time or more.

The fourth power-down control signal PWDDB_DATA_FIX may be a signal for controlling the floating prevention operation of the data path circuit area 420. The fourth power-down control signal PWDDB_DATA_FIX may have a wider activation period than the third power-down control signal PWDD_DATA_SW.

Because the aforementioned embodiment is an example in which the command/address signal CA provided from an external source is decoded through the command decoder 200 to generate the power-down mode signal CSEB, a separate dedicated logic, other than the command decoder 200, may generate the power-down mode signal CSEB according to the clock enable signal CKE provided from an external source.

Figure 3:
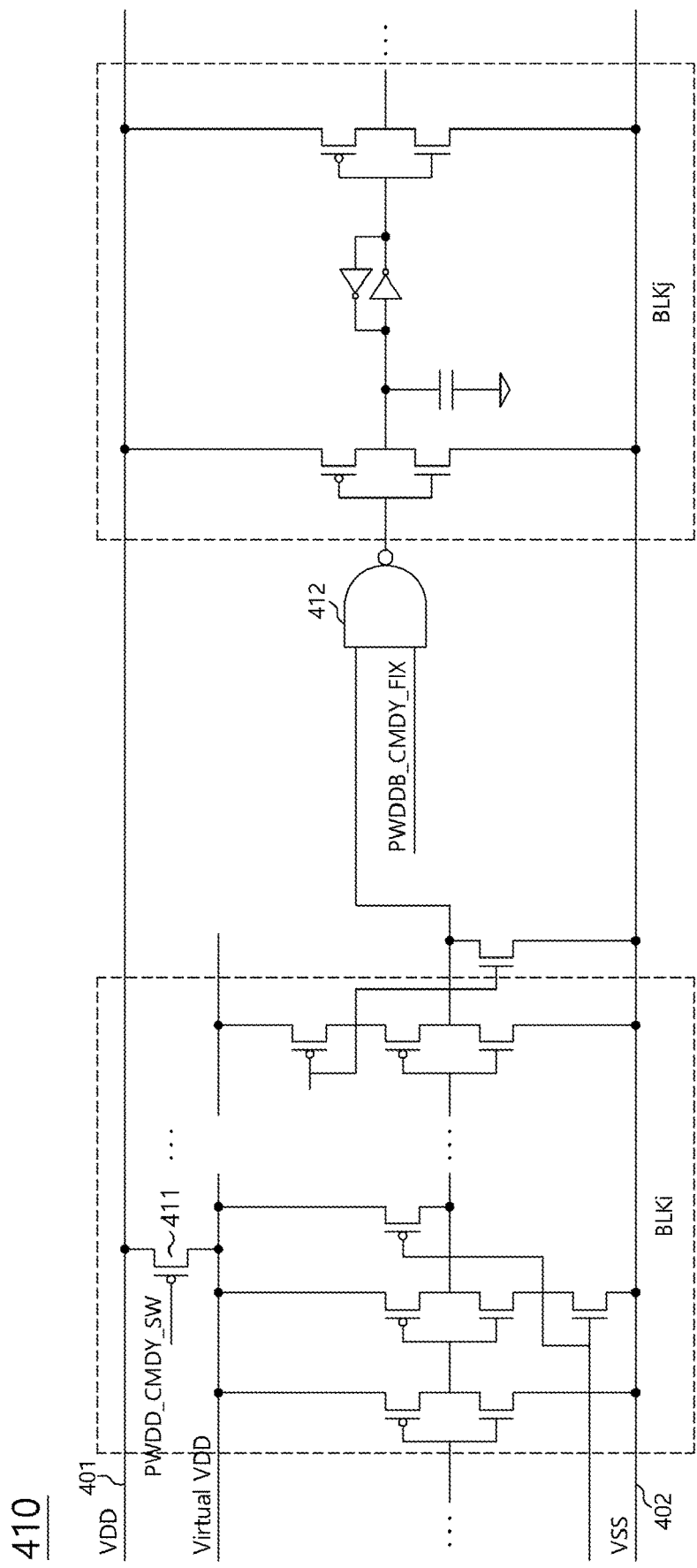
FIG. 3 is a schematic diagram illustrating a configuration of a command path circuit area in a logic circuit area of FIG. 2.

FIG. 3 is a diagram illustrating a configuration of the command path circuit area in the logic circuit area of FIG. 2.

As illustrated in FIG. 3, the command path circuit area 410 may include a plurality of logic circuit blocks BLK.

The plurality of logic circuit blocks BLK may be divided into the power gating blocks and the no power gating blocks.

The no power gating blocks may be included in the memory banks BK of FIG. 1, for example, as a configuration in which no power-down operation is required or the supply of power needs to be substantially maintained.

When the no power gating block is included in the plurality of logic circuit blocks BLK, the command path circuit area 410 may further include an isolator 412.

The power gating block, for example, BLKi may include a power-down switch 411 electrically connected between a first power rail 401 and a virtual power supply terminal Virtual VDD, and logic circuits electrically connected between the virtual power supply terminal Virtual VDD and a second power rail 402.

The power-down switch 411 may be turned on and off according to the first power-down control signal PWDD_CMDY_SW, thereby supplying the power supply voltage VDD to the internal logic circuits or blocking the supply of the power supply voltage VDD.

The no power gating block, for example, BLKj may include logic circuits electrically connected between the first power rail 401 and the second power rail 402.

The isolator 412 may output a signal at a specific logic level to the no power gating block BLKj according to the second power-down control signal PWDDB_CMDY_FIX, thereby substantially preventing the floating of the no power gating block.

Figure 4:
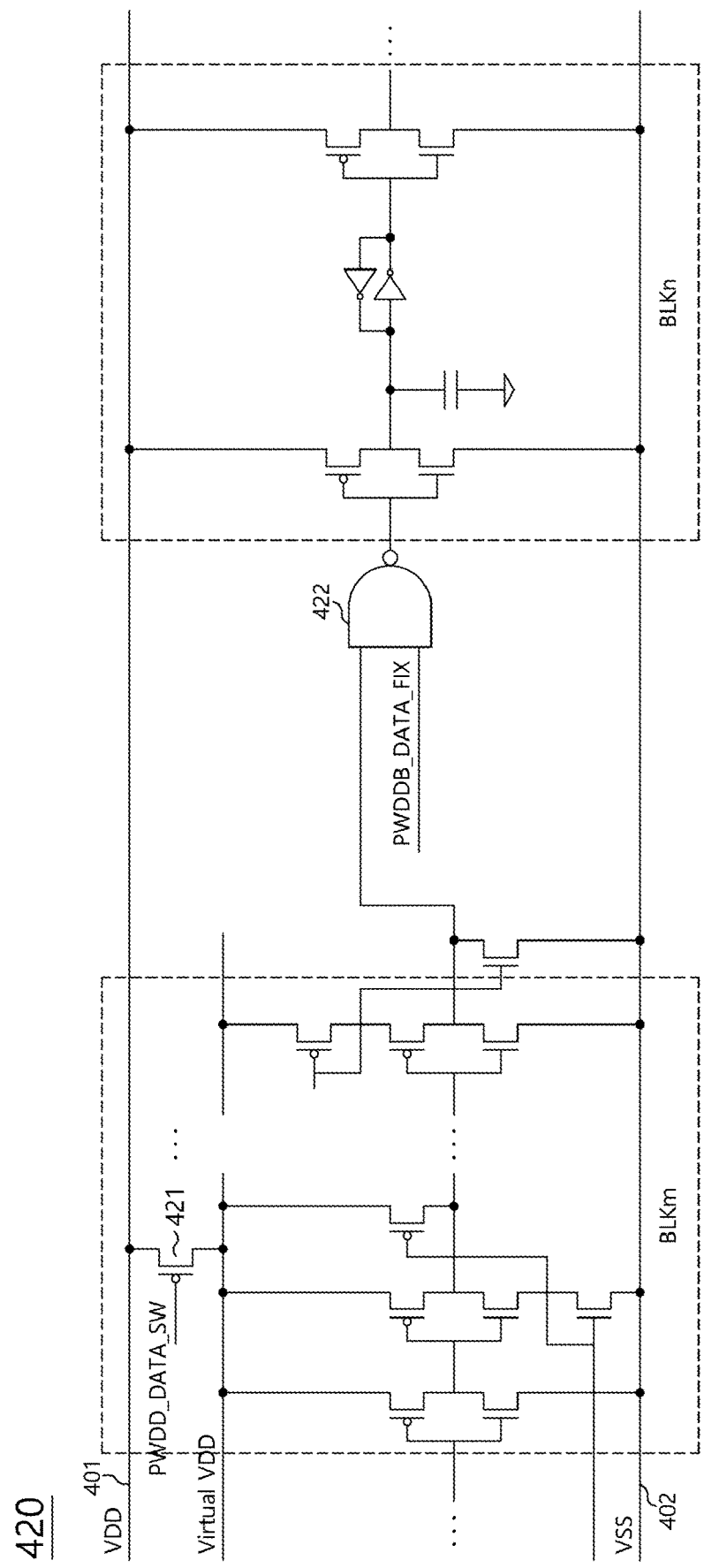
FIG. 4 is a schematic diagram illustrating a configuration of a data path circuit area in the logic circuit area of FIG. 2.

FIG. 4 is a diagram illustrating a configuration of the data path circuit area in the logic circuit area of FIG. 2.

The data path circuit area 420 of FIG. 2 may include a plurality of logic circuit blocks BLK.

The power gating block, for example, BLKm may include a power-down switch 421 electrically connected between the first power rail 401 and the virtual power supply terminal Virtual VDD, and logic circuits electrically connected between the virtual power supply terminal Virtual VDD and the second power rail 402.

The power-down switch 421 may be turned on and off according to the third power-down control signal PWDD_DATA_SW, thereby supplying the power supply voltage VDD to the internal logic circuits or blocking the supply of the power supply voltage VDD.

The no power gating block, for example, BLKn may include logic circuits electrically connected between the first power rail 401 and the second power rail 402.

An isolator 422 may output a signal at a specific logic level to the no power gating block BLKn according to the fourth power-down control signal PWDDB_DATA_FIX, thereby substantially preventing the floating of the no power gating block.

Figure 5:
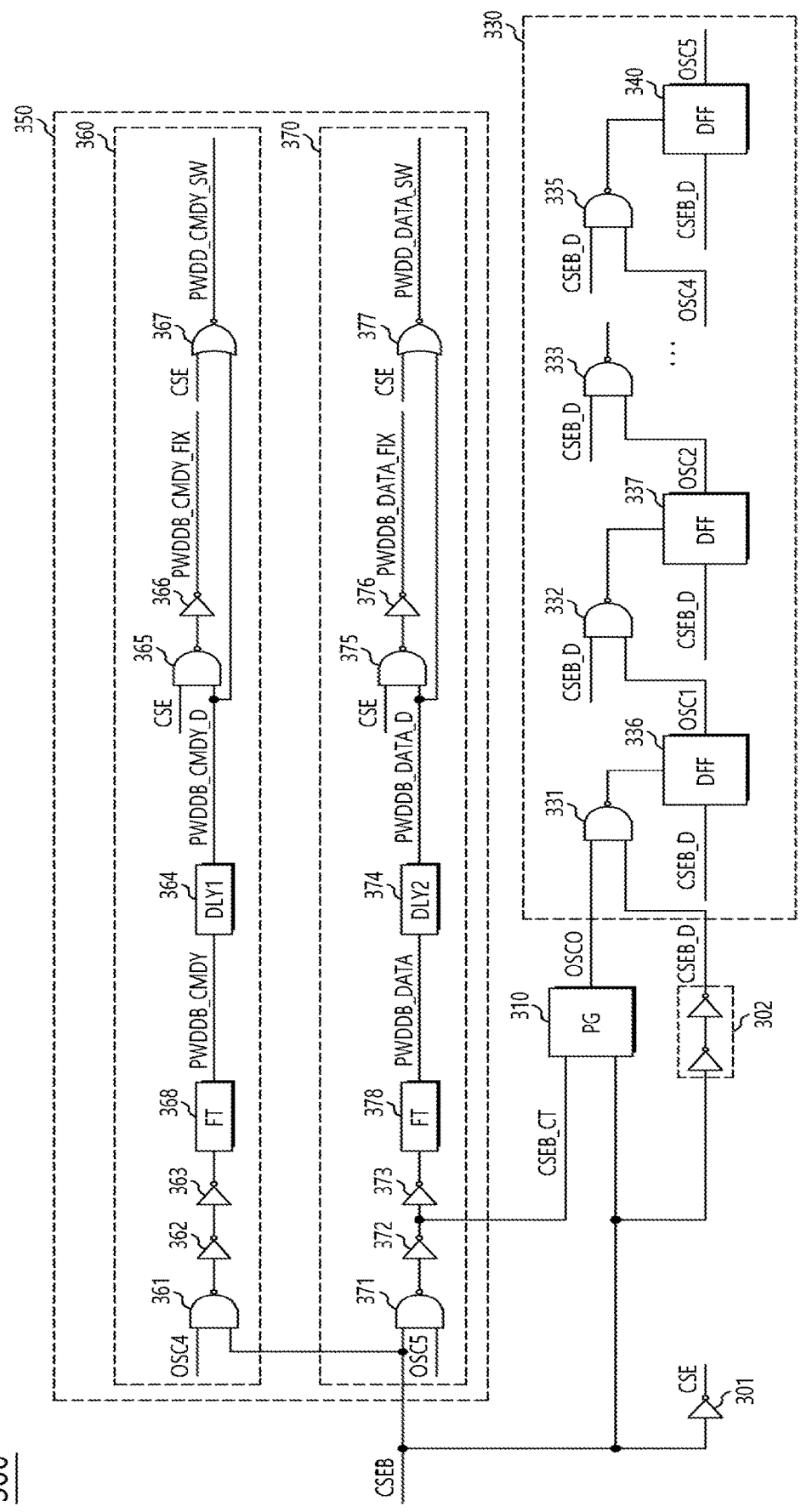
FIG. 5 is a schematic diagram illustrating a configuration of a power gating control circuit of FIG. 2.

FIG. 5 is a diagram illustrating a configuration of the power gating control circuit 300 of FIG. 2, and FIG. 6 is a timing diagram for explaining an operation of a power-down reference signal generation circuit 330 of FIG. 5.

As illustrated in FIG. 5, the power gating control circuit 300 may include a pulse generator 310, the power-down reference signal generation circuit 330, and a power-down control signal generation circuit 350.

The power gating control circuit 300 may further include a logic gate 301 that inverts the power-down mode signal CSEB to generate an inverted power-down mode signal CSE, and a logic gate 302 that delays the power-down mode signal CSEB to generate a delayed power-down mode signal CSEB_D.

The pulse generator 310 may generate an oscillation signal OSC0 according to the power-down mode signal CSEB. The pulse generator 310 may stop generating the oscillation signal OSC0 according to a signal CSEB_CT.

The pulse generator 310 may generate the oscillation signal OSC0 when the power-down mode signal CSEB is activated to a high level, as illustrated in FIG. 6.

The power-down reference signal generation circuit 330 may divide the oscillation signal OSC0 according to the delayed power-down mode signal CSEB_D, thereby generating a plurality of division signals OSC1 to OSC5, as illustrated in FIG. 6.

In an embodiment, at least one of the plurality of division signals OSC1 to OSC5 may be used as a power-down reference signal, and the following description is provided for an example in which OSC4 and OSC5 are used as a first power-down reference signal and a second power-down reference signal, respectively.

The power-down reference signal generation circuit 330 may be configured as a division circuit including a plurality of logic gates 331 to 335 and a plurality of flip-flops 336 to 340.

The logic gate 331 may perform a NAND operation on the delayed power-down mode signal CSEB_D and the output signal of the pulse generator 310, that is, the oscillation signal OSC0, and output the NANDed signal.

The flip-flop 336 may latch the delayed power-down mode signal CSEB_D according to the output signal of the logic gate 331, thereby outputting the division signal OSC1.

The division signal OSC1 may have a cycle corresponding to twice the oscillation signal OSC0.

The other logic gates 332 to 335 may perform a NAND operation on the delayed power-down mode signal CSEB_D and the output signal of the flip-flop at a previous stage, thereby outputting the NANDed signals, respectively.

The other flip-flops 337 to 340 may latch the delayed power-down mode signal CSEB_D according to the output signal of the logic gate at a previous stage, thereby generating the plurality of division signals OSC2 to OSC5, respectively.

The plurality of division signals OSC2 to OSC5 may have a cycle corresponding to twice a previous division signal.

The power-down control signal generation circuit 350 may generate the first to fourth power-down control signals PWDD_CMDY_SW, PWDDB_CMDY_FIX, PWDD_DATA_SW, and PWDDB_DATA_FIX according to the power-down mode signal CSEB and the first and second power-down reference signals OSC4 and OSC5.

When an activation period of the power-down mode signal CSEB capable of defining the power-down request period is substantially maintained up to activation timings of the first and second power-down reference signals OSC4 and OSC5, the power-down control signal generation circuit 350 may activate the first power-down control signal PWDD_CMDY_SW and the third power-down control signal PWDD_DATA_SW with a time difference.

When the activation period of the power-down mode signal CSEB is substantially maintained up to the activation timing of the first power-down reference signal OSC4 of a preceding timing between the first and second power-down reference signals OSC4 and OSC5, the power-down control signal generation circuit 350 may activate the first power-down control signal PWDD_CMDY_SW.

When the activation period of the power-down mode signal CSEB is substantially maintained up to the activation timing of the second power-down reference signal OSC5 of a late timing between the first and second power-down reference signals OSC4 and OSC5, the power-down control signal generation circuit 350 may activate the third power-down control signal PWDD_DATA_SW.

The power-down control signal generation circuit 350 may allow the second power-down control signal PWDDB_CMDY_FIX to have an activation period including the activation period of the first power-down control signal PWDD_CMDY_SW.

The power-down control signal generation circuit 350 may allow the fourth power-down control signal PWDDB_DATA_FIX to have an activation period including the activation period of the third power-down control signal PWDD_DATA_SW.

The power-down control signal generation circuit 350 may include a first generation circuit 360 and a second generation circuit 370.

The first generation circuit 360 may generate the first and second power-down control signals PWDD_CMDY_SW and PWDDB_CMDY_FIX according to the power-down mode signal CSEB, the first power-down reference signal OSC4, and the inverted power-down mode signal CSE.

The first generation circuit 360 may include a plurality of logic gates 361 to 363 and 365 to 367, a delay circuit (DLY1) 364, and a filter (FT) 368.

The logic gates 361 to 363 may perform a NAND operation on the power-down mode signal CSEB and the first power-down reference signal OSC4, and output the NANDed signal.

The filter 368 may remove noise of an output signal of the logic gate 363.

The filter 368 may filter the output signal of the logic gate 363 when a pulse width of the output signal of the logic gate 363 is equal to or less than a preset value (for example, several ns).

For example, during a period in which the first power-down reference signal OSC4 substantially maintains a high level, the abnormal power-down mode signal CSEB, other than the normal power-down mode signal CSEB, that is, noise may occur. Accordingly, the abnormal power-down mode signal CSEB may be removed through the filter 368.

The delay circuit 364 may delay an output signal PWDDB_CMDY of the filter 368 by a preset time, and output the delayed signal.

The logic gate 365 may perform a NAND operation on the inverted power-down mode signal CSE and an output signal PWDDB_CMDY_D of the delay circuit 364, and output the NANDed signal.

The logic gate 366 may invert an output signal of the logic gate 365 and output the inverted signal as the second power-down control signal PWDDB_CMDY_FIX.

The logic gate 367 may perform a NAND operation on the output signal PWDDB_CMDY_D of the delay circuit 364 and the inverted power-down mode signal CSE, and output the NANDed signal as the first power-down control signal PWDD_CMDY_SW.

The second generation circuit 370 may generate the third and fourth power-down control signals PWDD_DATA_SW and PWDDB_DATA_FIX according to the power-down mode signal CSEB, the second power-down reference signal OSC5, and the inverted power-down mode signal CSE.

The second generation circuit 370 may include a plurality of logic gates 371 to 373 and 375 to 377, a delay circuit (DLY2) 374, and a filter (FT) 378.

The logic gates 371 and 372 may perform a AND operation on the power-down mode signal CSEB and the second power-down reference signal OSC5, and output the ANDed signal CSEB_CT. The logic gates 371 to 373 may perform a NAND operation on the power-down mode signal CSEB and the second power-down reference signal OSC5, and output the NANDed signal PWDDB_DATA.

The filter 378 may remove noise of an output signal of the logic gate 373.

The filter 378 may filter the output signal of the logic gate 373 when a pulse width of the output signal of the logic gate 373 is equal to or less than a preset value (for example, several ns).

For example, during a period in which the second power-down reference signal OSC5 substantially maintains a high level, the abnormal power-down mode signal CSEB, other than the normal power-down mode signal CSEB, that is, noise may occur. Accordingly, the abnormal power-down mode signal CSEB may be removed through the filter 378.

The delay circuit 374 may delay an output signal PWDDB_DATA of the filter 378 by a preset time, and output the delayed signal.

The logic gate 375 may perform a NAND operation on the inverted power-down mode signal CSE and an output signal PWDDB_DATA_D of the delay circuit 374, and output the NANDed signal.

The logic gate 376 may invert an output signal of the logic gate 375 and output the inverted signal as the fourth power-down control signal PWDDB_DATA_FIX.

The logic gate 377 may perform a NAND operation on the output signal PWDDB_DATA_D of the delay circuit 374 and the inverted power-down mode signal CSE, and output the NANDed signal as the third power-down control signal PWDD_DATA_SW.

FIG. 7 is a timing diagram for explaining an operation of the power-down control signal generation circuit 350 of FIG. 5.

Hereinafter, the operation of the power gating system in accordance with an embodiment will be described with reference to FIG. 1 to FIG. 7.

After an activation of a power-up signal PWR, an external device, for example, the processor 30, may request the memory 20 to enter or exit from a power-down mode by using a combination of the chip select signal CS and the command/address signal CA, or the clock enable signal CKE.

For example, the processor 30 may request power-down mode entrance (PDE) by using the combination of the chip select signal CS and the command/address signal CA. In the power-down mode entrance state, the processor 30 may request power-down mode exit (PDX) as toggle of the chip select signal CS.

The power gating system 100 may activate the power-down mode signal CSEB as the power-down mode entrance (PDE) is requested from an external source, and substantially maintain the activation state until the power-down mode exit (PDX) is requested.

With the power-down mode entrance (PDE), all the power-down switches 411 and 421 of the logic circuit area 400 are driven, so that an internal voltage drop may occur. When time from the power-down mode entrance (PDE) to the power-down mode exit (PDX) is too short (for example, several ns), an internal voltage might not recover a normal level and thus the power-down switches 411 turned off for the power-down operation might not be turned on again, so that a power-down mode exit (PDX) operation might not be performed.

In an embodiment, the first power-down control signal PWDD_CMDY_SW might not be activated immediately as the power-down mode signal CSEB is activated, and may be activated after the first power-down reference signal OSC4 is activated.

That is, the first power-down reference signal OSC4 may be used as a reference for determining whether the activation period of the power-down mode signal CSEB is equal to or greater than an appropriate time required for the dropped internal voltage to recover to a normal level. The first power-down control signal PWDD_CMDY_SW may be activated after the first power-down reference signal OSC4 is activated.

As the first power-down control signal PWDD_CMDY_SW is activated, the power-down switches 411 of the power gating blocks of the command path circuit area 410 may be turned off to cut off the supply of power to the power gating blocks.

The second power-down control signal PWDDB_CMDY_FIX may be activated immediately as the power-down mode signal CSEB is activated, and may be deactivated after the power-down mode signal CSEB is deactivated and the delay time of the delay circuit (DLY1) passes.

As the second power-down control signal PWDDB_CMDY_FIX is activated, the isolators 412 of the command path circuit area 410 may output a signal at specific logic level, for example, a signal at a high level, thereby substantially preventing the floating of the no power gating blocks.

In an embodiment, the activation period of the second power-down control signal PWDDB_CMDY_FIX may be longer than that of the first power-down control signal PWDD_CMDY_SW, and may be allowed to include the activation period of the first power-down control signal PWDD_CMDY_SW.

Because the activation period of the second power-down control signal PWDDB_CMDY_FIX includes the activation period of the first power-down control signal PWDD_CMDY_SW, it is possible to stably and substantially prevent the floating of the no power gating blocks.

The third power-down control signal PWDD_DATA_SW might not be activated immediately as the power-down mode signal CSEB is activated, and may be activated after the second power-down reference signal OSC5 is activated.

As the third power-down control signal PWDD_DATA_SW is activated, the power-down switches 421 of the power gating blocks of the data path circuit area 420 may be turned off to cut off the supply of power to the power gating blocks.

The third power-down control signal PWDD_DATA_SW may be activated with a time difference with the first power-down control signal PWDD_CMDY_SW, that is, may be activated late.

In the embodiment, the logic circuit area 400 may be divided into the command path circuit area 410 and the data path circuit area 420, and the command path circuit area 410 and the data path circuit area 420 may be independently controlled by the first and second power-down control signals PWDD_CMDY_SW and PWDDB_CMDY_FIX and the third and fourth power-down control signals PWDD_DATA_SW and PWDDB_DATA_FIX.

After the power-down switches 411 of the command path circuit area 410 are driven and then a predetermined time passes, the power-down switches 421 of the data path circuit area 420 may be driven. Accordingly, a peak current may be reduced due to simultaneous driving of all the power-down switches 411 and 421 of the logic circuit area 400, so that it is possible to stably and substantially maintain an internal voltage and to substantially prevent an abnormal operation from occurring.

The fourth power-down control signal PWDDB_DATA_FIX may be activated immediately as the power-down mode signal CSEB is activated, and may be deactivated after the power-down mode signal CSEB is deactivated and the delay time of the delay circuit (DLY2) passes.

As the fourth power-down control signal PWDDB_DATA_FIX is activated, the isolators 422 of the data path circuit area 420 may output a signal at a specific logic level, for example, a signal at a high level, thereby substantially preventing the floating of the no power gating blocks.

The activation period of the fourth power-down control signal PWDDB_DATA_FIX may be longer than that of the third power-down control signal PWDD_DATA_SW, and may be allowed to include the activation period of the third power-down control signal PWDD_DATA_SW.

While various embodiments have been described above, it will be understood by those skilled in the art that the described embodiments represent only a limited number of possible embodiments. Accordingly, the power gating system and the electronic system including the same described herein should not be limited based on the described embodiments.

What is claimed is:

1. A power gating system comprising:
   a logic circuit area configured to perform a power-down operation according to at least one power-down control signal;
   a power gating control circuit configured to generate the at least one power-down control signal when a power-down request period is equal to or greater than a preset time according to a power-down mode signal; and
   a command decoder configured to generate the power-down mode signal by decoding a chip select signal and a command/address signal inputted from an external source.

2. The power gating system according to claim 1, wherein the logic circuit area comprises:
   a plurality of logic circuit blocks,
   wherein each of the plurality of logic circuit blocks includes a power-down switch electrically connected between a first power rail and a virtual power supply terminal and includes logic circuits electrically connected between the virtual power supply terminal and a second power rail.

3. The power gating system according to claim 1, wherein the power gating control circuit comprises:
   a pulse generator configured to generate an oscillation signal according to the power-down mode signal;
   a power-down reference signal generation circuit configured to divide the oscillation signal to generate a plurality of division signals and configured to output at least one of the plurality of division signals as a power-down reference signal; and
   a power-down control signal generation circuit configured to generate the at least one power-down control signal according to the power-down mode signal and the power-down reference signal.

4. The power gating system according to claim 3, wherein the power-down control signal generation circuit is further configured to activate the at least one power-down control signal when an activation period of the power-down mode signal is substantially maintained up to an activation timing of the power-down reference signal.

5. A power gating system comprising:
a logic circuit area divided into a first area and a second area, the logic circuit area configured to perform a power-down operation for the first area according to a first power-down control signal of a plurality of power-down control signals and configured to perform the power-down operation for the second area according to a third power-down control signal of the plurality of power-down control signals; and
a power gating control circuit configured to activate the third power-down control signal later than the first power-down control signal when a power-down request period according to a power-down mode signal is equal to or more than a preset time.

6. The power gating system according to claim 5, wherein the logic circuit area comprises:
a plurality of logic circuit blocks,
wherein each of the plurality of logic circuit blocks includes a power-down switch electrically connected between a first power rail and a virtual power supply terminal and includes logic circuits electrically connected between the virtual power supply terminal and a second power rail.

7. The power gating system according to claim 5, wherein the power gating control circuit comprises:
a pulse generator configured to generate an oscillation signal according to the power-down mode signal;
a power-down reference signal generation circuit configured to divide the oscillation signal to generate a plurality of division signals and configured to output some of the plurality of division signals as a plurality of power-down reference signals; and
a power-down control signal generation circuit configured to generate the plurality of power-down control signals according to the power-down mode signal and the plurality of power-down reference signals.

8. The power gating system according to claim 7, wherein the power-down control signal generation circuit is further configured to activate a signal provided to the first area and a signal provided to the second area with a time difference among the plurality of power-down control signals when an activation period of the power-down mode signal is substantially maintained up to an activation timing of the power-down reference signal.

9. The power gating system according to claim 5, further comprising:
a command decoder configured to generate the power-down mode signal by decoding a chip select signal and a command/address signal inputted from an external source.

10. A power gating system comprising:
a logic circuit area, including a plurality of logic circuit blocks, divided into a first area and a second area and configured to perform a power-down operation for the first area and the second area and perform a floating prevention operation for logic circuit blocks not subject to the power-down operation among the plurality of logic circuit blocks, according to first, second, third, and fourth power-down control signals; and
a power gating control circuit configured to generate the first, second, third, and fourth power-down control signals with a time difference, wherein a period of the floating prevention operation includes a period of the power-down operation, when a power-down request period according to a power-down mode signal is equal to or more than a preset time.

11. The power gating system according to claim 10, wherein the first area comprises:
logic circuit blocks related to command processing,
wherein among the logic circuit blocks related to the command processing, at least one logic circuit block is designed to be powered down by the power-down operation, wherein the at least one logic circuit block designed to be powered down comprises:
a power-down switch electrically connected between a first power rail and a virtual power supply terminal, wherein the power-down switch is configured to operate according to the first power-down control signal; and
logic circuits electrically connected between the virtual power supply terminal and a second power rail.

12. The power gating system according to claim 11, wherein among the logic circuit blocks related to the command processing, at least one logic circuit block is designed not to be powered down by the power-down operation, wherein the power gating system further comprises:
an isolator configured to output a signal at a specific logic level to the at least one logic circuit block designed not to be powered down by the power-down operation, among the logic circuit blocks related to the command processing, according to the second power-down control signal.

13. The power gating system according to claim 10, wherein the second area comprises:
logic circuit blocks related to data input/output,
wherein among the logic circuit blocks related to the data input/output, at least one logic circuit block is designed to be powered down by the power-down operation, wherein the at least one logic circuit block designed to be powered down comprises:
a power-down switch electrically connected between a first power rail and a virtual power supply terminal, wherein the power-down switch is configured to operate according to the third power-down control signal; and
logic circuits electrically connected between the virtual power supply terminal and a second power rail.

14. The power gating system according to claim 13, wherein among the logic circuit blocks related to the data input/output, at least one logic circuit block is designed not to be powered down by the power-down operation, wherein the power gating system further comprises:
an isolator configured to output a signal at a specific logic level to the at least one logic circuit block designed not to be powered down by the power-down operation, among the logic circuit blocks related to the data input/output, according to the fourth power-down control signal.

15. The power gating system according to claim 10, wherein the power gating control circuit comprises:
a pulse generator configured to generate an oscillation signal according to the power-down mode signal;
a power-down reference signal generation circuit configured to divide the oscillation signal to generate a plurality of division signals and configured to output two of the plurality of division signals as first and second power-down reference signals; and
a power-down control signal generation circuit configured to generate the first, second, third, and fourth power-down control signals according to the power-down mode signal and the first and second power-down reference signals.

16. The power gating system according to claim 15, wherein the power-down control signal generation circuit comprises:
a first generation circuit configured to activate the first power-down control signal when an activation period of the power-down mode signal is substantially maintained up to an activation timing of the first power-down reference signal and configured to generate the second power-down control signal having an activation period including an activation period of the first power-down control signal; and
a second generation circuit configured to activate the third power-down control signal when the activation period of the power-down mode signal is substantially maintained up to an activation timing of the second power-down reference signal having a later timing than the first power-down reference signal and configured to generate the fourth power-down control signal having an activation period including an activation period of the third power-down control signal.

17. The power gating system according to claim 10, further comprising:
a command decoder configured to generate the power-down mode signal by decoding a chip select signal and a command/address signal inputted from an external source.

18. An electronic system comprising:
a processor configured to generate a power-down command by using a chip select signal and a command/address signal; and
a semiconductor memory including a logic circuit area divided into a first area and a second area and configured to perform a power-down operation for the first area and the second area with a time difference when a power-down period according to the power-down command is equal to or greater than a preset time.

19. The electronic system according to claim 18, wherein the semiconductor memory comprises:
the logic circuit area including a plurality of logic circuit blocks divided into the first area and the second area and configured to perform a power-down operation for the first area and the second area and to perform a floating prevention operation for logic circuit blocks, of the plurality of logic circuit blocks, not subject to the power-down operation, according to first, second, third, and fourth power-down control signals;
a command decoder configured to generate the power-down mode signal by decoding the chip select signal and the command/address signal; and
a power gating control circuit configured to generate the first, second, third, and fourth power-down control signals for performing the power-down operation for the first area and the second area with a time difference, wherein a period of the floating prevention operation includes a period of the power-down operation, when an activation period of the power-down mode signal is equal to or more than a preset time.

20. The electronic system according to claim 19, wherein the first area comprises:
logic circuit blocks related to command processing,
wherein among the logic circuit blocks related to the command processing, at least one logic circuit block is designed to be powered down by the power-down operation, wherein the at least one logic circuit block designed to be powered down comprises:
a power-down switch electrically connected between a first power rail and a virtual power supply terminal, wherein the power-down switch is configured to operate according to the first power-down control signal; and
logic circuits electrically connected between the virtual power supply terminal and a second power rail.

21. The electronic system according to claim 20, wherein among the logic circuit blocks related to the command processing, at least one logic circuit block is designed not to be powered down by the power-down operation, wherein the electronic system further comprises:
an isolator configured to output a signal at a specific logic level to the at least one logic circuit block designed not to be powered down by the power-down operation, among the logic circuit blocks related to the command processing, according to the second power-down control signal.

22. The electronic system according to claim 19, wherein the second area comprises:
logic circuit blocks related to data input/output,
wherein among the logic circuit blocks related to the data input/output, at least one logic circuit block is designed to be powered down by the power-down operation, wherein the at least one logic circuit block designed to be powered down comprises:
a power-down switch electrically connected between a first power rail and a virtual power supply terminal, wherein the power-down switch is configured to operate according to the third power-down control signal; and
logic circuits electrically connected between the virtual power supply terminal and a second power rail.

23. The electronic system according to claim 22, wherein among the logic circuit blocks related to the data input/output, at least one logic circuit block is designed not to be powered down by the power-down operation, wherein the electronic system further comprises:
an isolator configured to output a signal at a specific logic level to the at least one logic circuit block designed not to be powered down by the power-down operation, among the logic circuit blocks related to the data input/output, according to the fourth power-down control signal.

24. The electronic system according to claim 19, wherein the power gating control circuit comprises:
a pulse generator configured to generate an oscillation signal according to the power-down mode signal;
a power-down reference signal generation circuit configured to divide the oscillation signal to generate a plurality of division signals and configured to output two of the plurality of division signals as first and second power-down reference signals; and
a power-down control signal generation circuit configured to generate the first, second, third, and fourth power-down control signals according to the power-down mode signal and the first and second power-down reference signals.

25. The electronic system according to claim 24, wherein the power-down control signal generation circuit comprises:
a first generation circuit configured to activate the first power-down control signal when the activation period of the power-down mode signal is substantially maintained up to an activation timing of the first power-down reference signal and configured to generate the second power-down control signal having an activation period including an activation period of the first power-down control signal; and a second generation circuit configured to activate the third power-down control signal when the activation period of the power-down mode signal is substantially maintained up to an activation timing of the second power-down reference signal having a later timing than the first power-down reference signal and configured to generate the fourth power-down control signal having an activation period including an activation period of the third power-down control signal.

\* \* \* \* \*